United States Patent
Wu et al.

(10) Patent No.: US 9,218,891 B2
(45) Date of Patent: Dec. 22, 2015

(54) DATA STORAGE DEVICE AND FLASH MEMORY CONTROL METHOD

(71) Applicant: Silicon Motion, Inc., Jhubei (TW)

(72) Inventors: Chia-Chien Wu, Hualien (TW);
Yu-Chih Lin, New Taipei (TW);
Yen-Hung Lin, New Taipei (TW)

(73) Assignee: Silicon Motion, Inc., Jhubei (TW)

( * ) Notice: Subject to any disclaimer, the term of this patent is extended or adjusted under 35 U.S.C. 154(b) by 122 days.

(21) Appl. No.: 14/091,908

(22) Filed: Nov. 27, 2013

(65) Prior Publication Data
US 2015/0146486 A1    May 28, 2015

(51) Int. Cl.
G11C 11/34    (2006.01)
G11C 16/34    (2006.01)
G11C 16/10    (2006.01)

(52) U.S. Cl.
CPC ............ *G11C 16/3459* (2013.01); *G11C 16/10* (2013.01)

(58) Field of Classification Search
USPC .................................................. 365/185.04
See application file for complete search history.

(56) References Cited

U.S. PATENT DOCUMENTS

| | | | | |
|---|---|---|---|---|
| 8,307,151 B1* | 11/2012 | Caraccio | ............ | G06F 12/0223 711/103 |
| 8,601,211 B2* | 12/2013 | Flynn | ............ | G06F 1/183 710/22 |
| 8,972,746 B2* | 3/2015 | Johnson | ............ | G06F 21/6218 713/189 |
| 2012/0063231 A1* | 3/2012 | Wood | ............ | G11C 16/10 365/185.18 |
| 2012/0159184 A1* | 6/2012 | Johnson | ............ | G06F 12/1466 713/189 |
| 2012/0210113 A1* | 8/2012 | Wood | ............ | G06F 21/575 713/2 |
| 2012/0236654 A1* | 9/2012 | Hemink | ............ | G11C 11/5628 365/185.19 |
| 2013/0121072 A1* | 5/2013 | Li | ............ | G06F 12/0893 365/185.03 |
| 2013/0159726 A1* | 6/2013 | Mckeen | ............ | G06F 21/72 713/189 |
| 2013/0198853 A1* | 8/2013 | Mckeen | ............ | G06F 21/72 726/26 |
| 2013/0205110 A1* | 8/2013 | Kettner | ............ | H03M 7/6064 711/170 |

(Continued)

FOREIGN PATENT DOCUMENTS

| | | |
|---|---|---|
| CN | 1534509 A | 10/2004 |
| CN | 1902599 A | 1/2007 |

(Continued)

OTHER PUBLICATIONS

Office Action of corresponding TW application, published on Jul. 17, 2015.

(Continued)

*Primary Examiner* — Hoai V Ho
*Assistant Examiner* — Pablo Huerta
(74) *Attorney, Agent, or Firm* — Wang Law Firm, Inc.; Li K. Wang; Stephen Hsu

(57) ABSTRACT

A data storage device using a FLASH memory with replay-protected blocks. The storage space of the FLASH memory is divided into blocks and each block is further divided into pages. A controller is provided in the data storage device to couple to the FLASH memory. The controller manages at least one replay-protected memory block of the FLASH memory. The controller programs a success flag and a write count into a system block of the FLASH memory after the controller programs two pages into the at least one replay-protected memory block of the FLASH memory. The controller may perform a power restoration process based on the success flag of the system block or/and based on the amount of programmed pages of the at least one replay-protected memory block.

22 Claims, 4 Drawing Sheets

(56) References Cited

U.S. PATENT DOCUMENTS

| | | | |
|---|---|---|---|
| 2013/0232344 A1* | 9/2013 | Johnson | G06F 12/1466 713/193 |
| 2013/0339585 A1* | 12/2013 | Conley | G06F 12/0246 711/103 |
| 2014/0173173 A1* | 6/2014 | Battu | G06F 12/0246 711/103 |
| 2014/0281151 A1* | 9/2014 | Yu | G06F 1/30 711/103 |
| 2014/0281456 A1* | 9/2014 | Mejia | G06F 21/575 713/2 |
| 2014/0282868 A1* | 9/2014 | Sheller | G06F 21/31 726/3 |
| 2014/0310535 A1* | 10/2014 | Sibert | G06F 21/572 713/193 |
| 2015/0006984 A1* | 1/2015 | Strasser | G06F 12/0246 714/721 |
| 2015/0043277 A1* | 2/2015 | Fitzpatrick | G11C 16/10 365/185.11 |
| 2015/0089173 A1* | 3/2015 | Chhabra | G06F 12/145 711/163 |

FOREIGN PATENT DOCUMENTS

| | | |
|---|---|---|
| TW | 527604 B | 4/2003 |
| WO | 2012126729 A1 | 9/2012 |

OTHER PUBLICATIONS

Office Action and citations of corresponding U.S. Appl. No. 14/096,740, published Aug. 20, 2015.

Office Action of corresponding TW application, published on Aug. 26, 2015.

\* cited by examiner

DATA STORAGE DEVICE AND FLASH MEMORY CONTROL METHOD

BACKGROUND OF THE INVENTION

1. Field of the Invention

The present invention relates to data storage devices, and in particular, relates to FLASH memory control methods.

2. Description of the Related Art

Flash memory is a general non-volatile storage device that is electrically erased and programmed. A NAND Flash, for example, is primarily used in memory cards, USB flash devices, solid-state drives, eMMCs (embedded MultiMediaCards), and so on. Generally, a storage array of a Flash memory (e.g. a NAND Flash) comprises a plurality of blocks. Each block comprises a plurality of pages. To release a block as a spare block, all pages of the entire block have to be erased at once.

For data security, some blocks of a FLASH memory are allocated to be replay-protected memory blocks (abbreviated to RPMBs). In comparison with the other blocks, the RPMBs are managed in a higher security level. Data management of the RPMBs is especially important.

BRIEF SUMMARY OF THE INVENTION

A data storage device and a FLASH memory control method are disclosed.

A data storage device in accordance with an exemplary embodiment of the invention comprises a FLASH memory and a controller. The storage space of the FLASH memory is divided into blocks and each block is further divided into pages. The controller is coupled to the FLASH memory. The controller manages at least one replay-protected memory block (RPMB) of the FLASH memory. The controller programs a success flag and a write count into a system block of the FLASH memory after the controller programs two pages into the at least one replay-protected memory block of the FLASH memory. The controller may perform a power restoration process based on the success flag of the system block or/and based on the amount of programmed pages of the at least one replay-protected memory block.

In accordance with another exemplary embodiment of the invention, a FLASH memory control method is disclosed. According to the disclosed control method, at least one replay-protected memory block of a FLASH memory is managed. Further, a success flag and a write count are written into a system block of the FLASH memory after programming two pages into the at least one replay-protected memory block of the FLASH memory. A power restoration process for the FLASH memory may be performed based on the success flag of the system block or/and based on the amount of programmed pages of the at least one replay-protected memory block.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows several exemplary embodiments carrying out the invention. This description is made for the purpose of illustrating the general principles of the invention and should not be taken in a limiting sense. The scope of the invention is best determined by reference to the appended claims.

Figure 1:
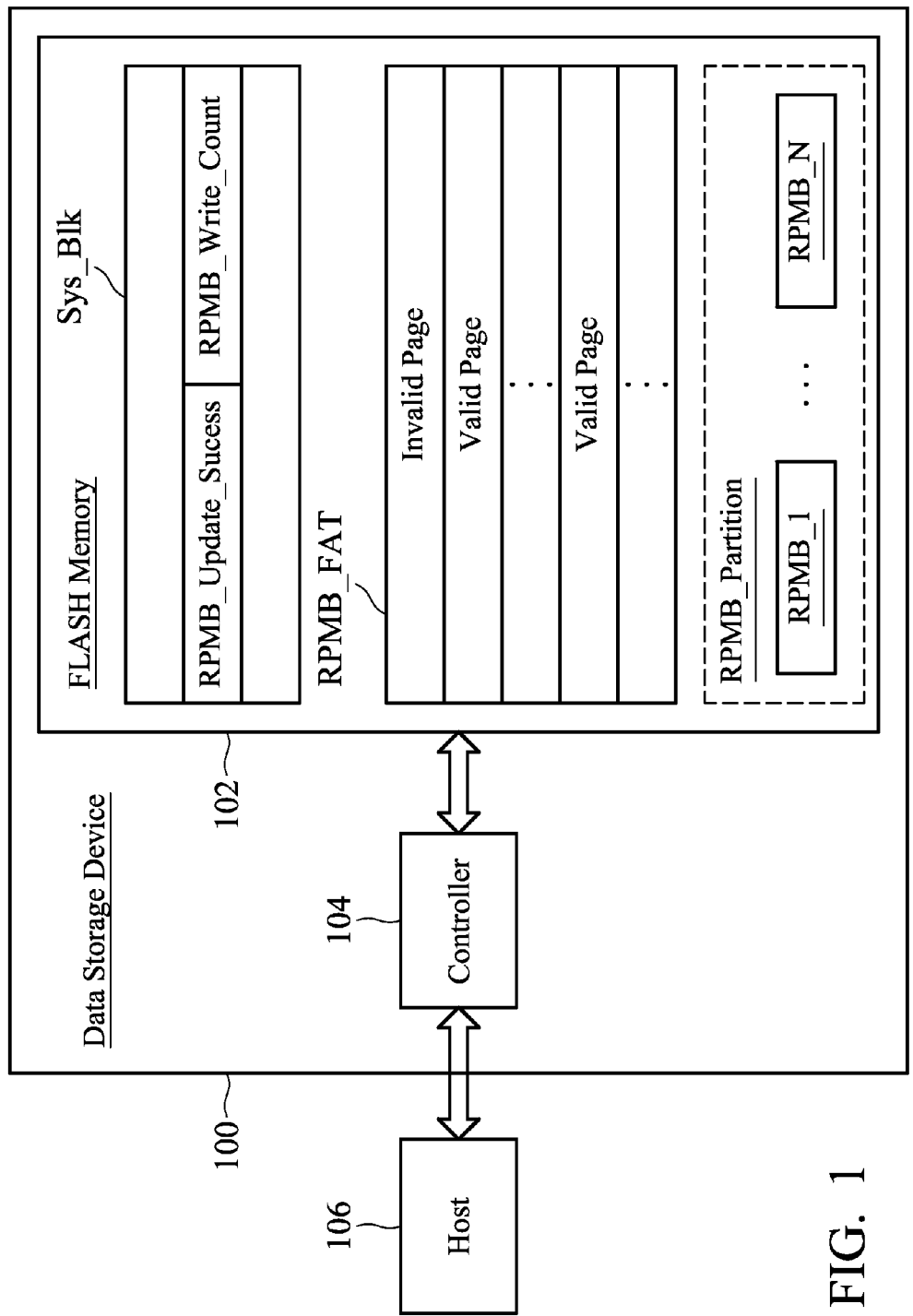
FIG. 1 is a block diagram depicting a data storage device 100 in accordance with an exemplary embodiment of the invention.

FIG. 1 is a block diagram depicting a data storage device 100 in accordance with an exemplary embodiment of the invention. The data storage device 100 comprises a FLASH memory 102 and a controller 104 coupled to the FLASH memory 102. The controller 104 may operate the FLASH memory 102 according to commands issued from a host 106.

The storage space of the FLASH memory 102 is divided into blocks and each block is further divided into pages. For simplicity, only the blocks relating to the replay-protected memory technique are shown in the figure. As shown, the FLASH memory 102 contains a partition RPMB_Partition of the replay-protected memory blocks RPMB_1 to RPMB_N. An authentication key is required to access the replay-protected memory blocks RPMB_1 to RPMB_N. The replay-protected memory blocks may be abbreviated as RPMBs. A host, e.g. 106, may issue an RPMB data update command in a single frame or multiple frames, depending on the update data length. A MAC value evaluated from the authentication key is attached in the final frame to be verified by the controller 104. The RPMB data update is allowed only when the MAC value is correct. When the MAC value is incorrect, the RPMB update command is ignored.

Note that a FAT block RPMB_FAT is allocated for data buffering. Update data issued from the host 106 is first buffered in the FAT block RPMB_FAT. When the FAT block RPMB_FAT is filled up, the FAT block RPMB_FAT is regarded as a replay-protected memory block and is classified into the partition RPMB_Partition. Meanwhile, another spare block of the FLASH memory 102 may be allocated to play the role of the FAT block RPMB_FAT.

According to the disclosure, the controller 104 allocates N pages of the FAT block RPMB_FAT of the FLASH memory 102 for each update of data of the replay-protected memory blocks no matter what update data length is issued. N depends on the amount of frames required for the host 106 to issue an update, of a longest data length, of the replay-protected memory blocks. In an exemplary embodiment, each frame transmits 256 bytes of RPMB data and 256 bytes of update information (e.g. a write count of 4 bytes, an update address of 2 bytes, an error detecting code of 2 bytes, a MAC value of 32 bytes and so on). When the update data length is 256 bytes, the host 106 issues the update of RPMB data in a single frame. When the update data length is 512 bytes, longer than the transmission capability (256 bytes) of a single frame, the host 106 issues the update of RPMB data in two frames. In a case wherein the longest update of RPMB data is 512 bytes, N is set to be 2. The controller 104 allocates 2 pages of the FAT block RPMB_FAT of the FLASH memory 102 for each update of data of the replay-protected memory blocks no matter what update data length is issued. When the host 106 just issues a data update of 256 bytes for the replay-protected memory blocks, the controller 104 fills up the allocated 2 pages with dummy data in addition to the 256 bytes of data issued by the host 106. In this manner, each successful RPMB data update should result in N valid pages in the FAT block RPMB_FAT.

Further, RPMB information such as an update success flag RPMB_Update_Success suggested in the disclosure and a write count RPMB_Write_Count generally utilized in RPMB management may be recorded in a system block Sys_BLK of the FLASH memory 102. In other exemplary embodiments, the system block is also a FAT block of the Flash memory. Note that the update success flag RPMB_Update_Success and the write count RPMB_Write_Count are recorded together within a single page. Every time the allocated N pages of the FAT block RPMB_FAT are all written with data, the controller 104 asserts an update success flag RPMB_Update_Success (e.g., asserted as a success flag) and updates a write count RPMB_WriteCount. The assertion of the update success flag RPMB_Update_Success is tied to the update of the write count RPMB_Write_Count. Thus, the update success flag RPMB_Update_Success is of high reliability.

The FAT block RPMB_FAT or/and the update success flag RPMB_Update_Success are checked by the controller 104 during a power restoration process, to recognize whether a power failure event happened before and if so, what time it happened. During the power restoration process, when the controller 104 observes that the amount of valid pages in the FAT block RPMB_FAT is a multiple of N and the update success flag RPMB_Update_Success has been asserted, the controller 120 accepts the data written in the last allocated N pages.

In some exemplary embodiments, the controller 102 keeps the update success flag RPMBUpdate_Success asserted until a start page of the next allocated N pages is written with data. During the power restoration process, when the controller 104 observes that the amount of valid pages in the FAT block RPMB_FAT is not a multiple of N, the controller 104 ignores the last update for the replay-protected memory blocks. Further, during the power restoration process, when the controller 104 observes that the update success flag RPMB_Update_Success has not been asserted, the controller 104 also ignores the last update for the replay-protected memory blocks. During the power restoration process, when the controller 104 observes that the amount of valid pages in the FAT block RPMB_FAT is a multiple of N and the update success flag RPMB_Update_Success has been asserted, the controller 104 confirms data synchronization within each update of the replay protect memory blocks.

Figure 2:
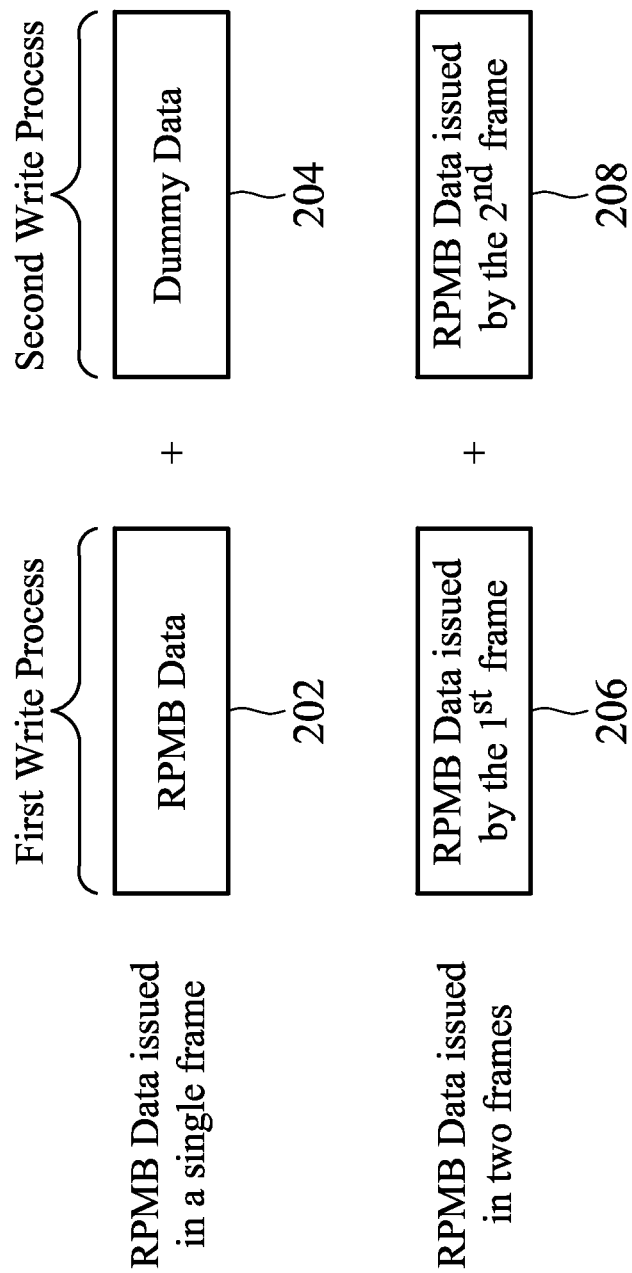
FIG. 2 depicts how an RPMB data update issued from the host 106 is processed by the controller 104 when N is set to be 2.

FIG. 2 depicts how an RPMB data update issued from the host 106 is processed by the controller 104 when N is set to be 2. When the host 106 issues a shorter RPMB update data (e.g. 256 bytes) in a single frame, the controller 104 performs a first write process on the FLASH memory 102 to write the issued RPMB data 202 into the 1$^{st}$ allocated page in the FAT block RPMB_FAT and then performs a second write process on the FLASH memory 102 to write dummy data 204 into the 2$^{nd}$ allocated page in the FAT block RPMB_FAT. When the host 106 issues a longer RPMB update data (e.g. 512 bytes) in two frames, the controller 104 writes the RPMB data issued in the two different frames separately. As shown, the RPMB data 206 issued in the first frame is written into the 1$^{st}$ allocated page of the FAT block RPMB_FAT via a first write process and the RPMB data 208 issued in the second frame is written into the 2$^{nd}$ allocated page in the FAT block RPMB_FAT via a second write process. In this manner, each successful RPMB data update should result in 2 valid pages in the FAT block RPMB_FAT.

Figure 3:
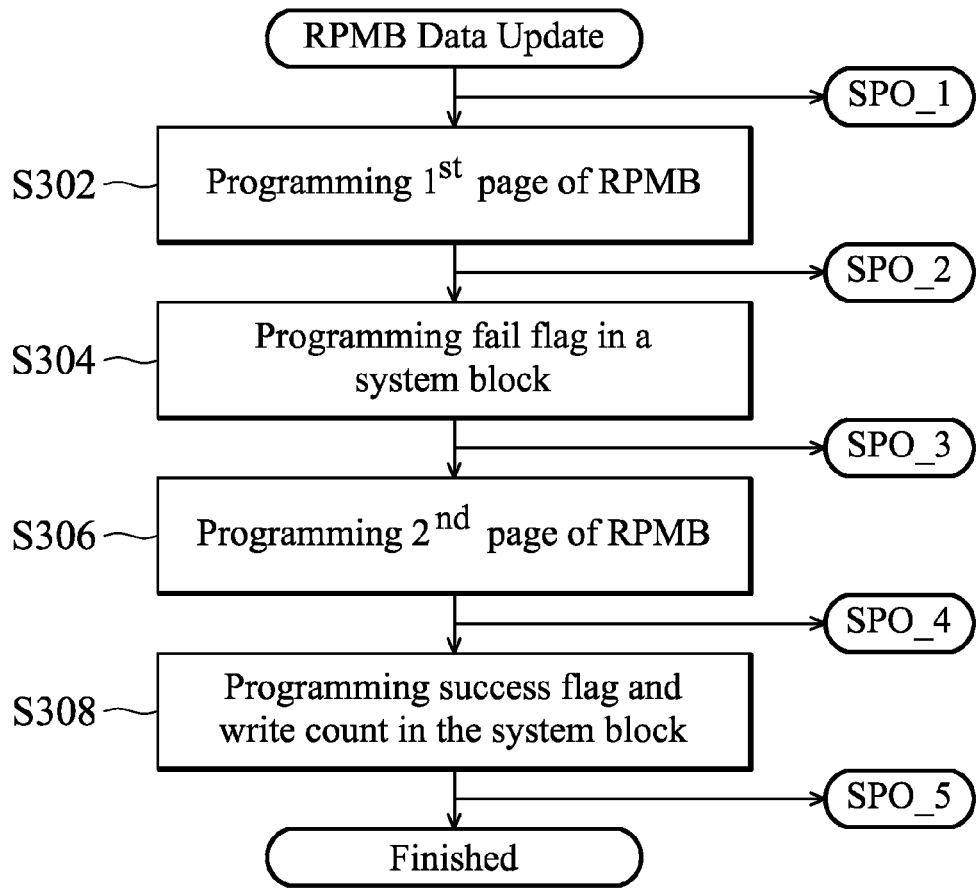
FIG. 3 is a flowchart depicting how the update success flag RPMB_Update_Success and the write count RPMB_Write_Count are controlled during the RPMB data update procedure shown in FIG. 2.

FIG. 3 is a flowchart depicting how the update success flag RPMB_Update_Success and the write count RPMB_Write_Count are controlled during the RPMB data update procedure shown in FIG. 2. In step S302, the first page allocated in the FAT block RPMB_FAT for the two-paged RPMB write is programmed. After the first write process S302 is performed, the update success flag RPMB_Update_Success is refreshed to "Fail" (e.g., programming a fail flag) in step S304. The second write process S306 is performed after step S304, by which the second page allocated in the FAT block RPMB_FAT for the two-paged RPMB write is programmed. After the second write process S306 is performed, the update success flag RPMB_Update_Success is asserted as "Success" (e.g., programming a success flag) and the write count RPMB_Write_Count is updated (e.g. increased by 1). After the step S308, the RPMB data update procedure may be finished. As shown in FIG. 3, power fail events may occur at any time. A power fail event occurs before the first write process S302 is a first sudden power off event SPO_1. A power fail event occurs between the first write process S302 and the update success flag RPMB_Update_Success control step S304 is a second sudden power off event SPO_2. A power fail event occurs between the update success flag RPMB_Update_Success control step S304 and the second write process S306 is a third sudden power off event SPO_3. A power fail event occurs between the second write process S306 and the update success flag RPMB_Update_Success and the write count RPMB_Write_Count control step S308 is a forth sudden power off event SPO_4. A power fail event occurs after the update success flag RPMB_Update_Success and the write count RPMB_Write_Count control step S308 is a fifth sudden power off event SPO_5. The different power fail events may be distinguished from each other based on the FAT block RPMB_FAT and/or the update success flag RPMB_Update_Success.

Figure 4:
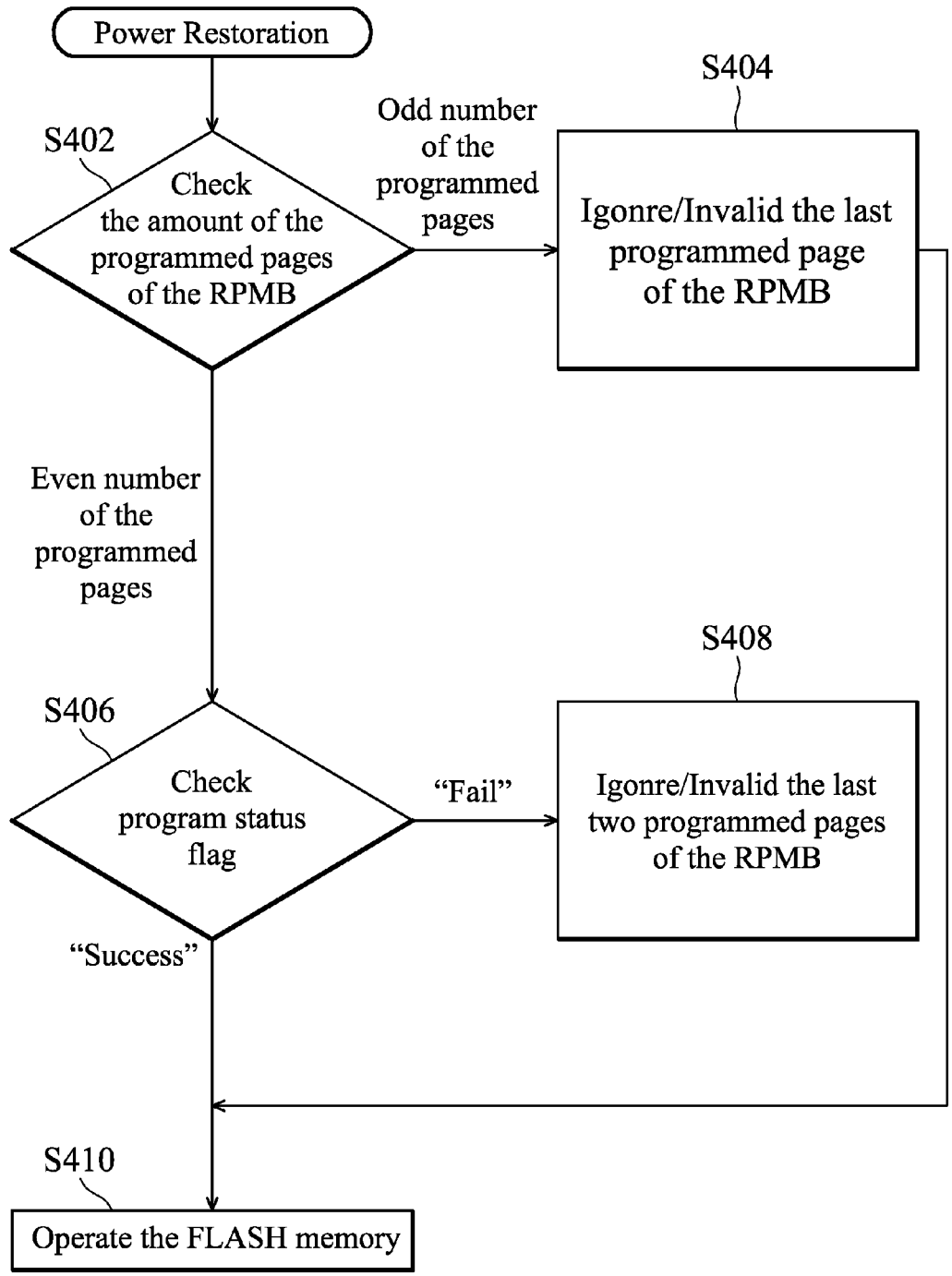
FIG. 4 is a flowchart depicting a power restoration process with respect to the RPMB update procedure of FIG. 3.

FIG. 4 is a flowchart depicting a power restoration process with respect to the RPMB update procedure of FIG. 3. In step S402, the FAT block RPMB_FAT is checked. As shown, the amount of programmed pages of the RPMB is checked. When there is an odd number of programmed pages in the FAT block RPMB_FAT, it means that the power failure event SPO_2 or the power failure event SPO_3 occurred before. Thus, step S404 is performed and thereby the last programmed page of the FAT block RPMB_FAT is ignored. When it is determined in step S402 that there is an even number of programmed pages in the FAT block RPMB_FAT and it is determined in step S406 that the update success flag RPMB_Update_Success is "Fail", it means that the power failure event SPO_4 occurred before. Thus, step S408 is performed and thereby the last programmed two pages of the FAT block RPMB_FAT are both ignored. When it is determined in step S402 that there is an even number of programmed pages in the FAT block RPMB_FAT and it is determined in step S406 that the update success flag RPMB_Update_Success is "Success", it means that the power failure event SPO_1 or the power failure event SPO_5 occurred before. Because the data update had not happened yet when the power failure event SPO_1 occurs and the data updated is finished when the power failure event SPO_5 occurs, there is no data asynchronous problem due to the power failure events SPO_1 and SPO_5. Thus, data synchronization within each update of the replay protect memory blocks is confirmed and the step S410 is performed to operate the FLASH memory without changing any page status of the FAT block RPMB_FAT.

In some exemplary embodiments, the controller 106 may include a computing unit and a read-only memory (ROM) stored with a ROM code. The ROM code may be coded according to the disclosure to be executed by the computing unit. The disclosed RPMB management, therefore, may be implemented by firmware. Further, any control method for a FLASH memory involving the disclosed RPMB management is also in the scope of the invention.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
   a FLASH memory with a storage space divided into blocks, wherein each block is further divided into pages; and
   a controller coupled to the FLASH memory to manage at least one replay-protected memory block of the FLASH memory,
   wherein:
   the controller programs a success flag and a write count into a system block of the FLASH memory after the controller programs two pages into the at least one replay-protected memory block of the FLASH memory;
   during a power restoration process, the controller checks the amount of programmed pages of the at least one replay-protected memory block; and
   during the power restoration process, the controller ignores the last programmed page of the at least one replay-protected memory block when there is an odd number of programmed pages of the at least one replay-protected memory block.

2. The data storage device as claimed in claim 1, wherein:
   the system block is a FAT block of the Flash memory.

3. The data storage device as claimed in claim 1, wherein:
   the controller further programs a fail flag into the system block after a first page of the two pages has been programmed into the at least one replay-protected block but a second page of the two pages has not been programmed into the at least one replay-protected block yet.

4. The data storage device as claimed in claim 1, wherein:
   the controller programs the success flag and the write count within the same page.

5. The data storage device as claimed in claim 1, wherein:
   when data issued from a host to be programmed into the at least one replay-protected memory block is shorter than two pages, the controller fills the data up to two pages with dummy data.

6. The data storage device as claimed in claim 1, wherein:
   during the power restoration process, the controller checks the system block to recognize whether a power failure event happened.

7. The data storage device as claimed in claim 6, wherein:
   during the power restoration process, the controller checks the success flag in the system block.

8. The data storage device as claimed in claim 7, wherein:
   during the power restoration process, the controller accepts the latest updated two pages when the success flag is found in the system block.

9. The data storage device as claimed in claim 1, wherein:
   during the power restoration process, the controller ignores the last two programmed pages of the at least one replay-protected memory block when there is an even number of programmed pages of the at least one replay-protected memory block but no success flag is found in the system block.

10. The data storage device as claimed in claim 1, wherein:
    during the power restoration process, the controller accepts the last two programmed pages of the at least one replay-protected memory block when there is an even number of programmed pages of the at least one replay-protected memory block and the success flag is found in the system block.

11. The data storage device as claimed in claim 1, wherein:
    during the power restoration process, the controller confirms data synchronization of the at least one replay-protected memory block when there is an even number of programmed pages of the at least one replay-protected memory block and the success flag is found in the system block.

12. A FLASH memory control method, comprising:
    managing at least one replay-protected memory block of a FLASH memory;
    programming a success flag and a write count into a system block of the FLASH memory after programming two pages into the at least one replay-protected memory block of the FLASH memory;
    checking, during a power restoration process, the amount of programmed pages of the at least one replay-protected memory block; and
    ignoring, during the power restoration process, the last programmed page of the at least one replay-protected memory block when there is an odd number of programmed pages of the at least one replay-protected memory block.

13. The FLASH memory control method as claimed in claim 12, wherein:
    the system block is a FAT block of the Flash memory.

14. The FLASH memory control method as claimed in claim 12, further comprising:
    programming a fail flag into the system block after a first page of the two pages has been programmed into the at least one replay-protected block but a second page of the two pages has not been programmed into the at least one replay-protected block yet.

15. The FLASH memory control method as claimed in claim 12, wherein:
    the success flag and the write count are programmed within the same page.

16. The FLASH memory control method as claimed in claim 12, wherein:
    data issued from a host to be programmed into the at least one replay-protected memory block but shorter than two pages is filled up to two pages with dummy data.

17. The FLASH memory control method as claimed in claim 12, further comprising:
    checking the system block during the power restoration process, to recognize whether a power failure event happened.

18. The FLASH memory control method as claimed in claim 17, further comprising:
    checking the success flag in the system block during the power restoration process.

19. The FLASH memory control method as claimed in claim 18, wherein:
    confirming, during the power restoration process, the latest updated two pages when the success flag is found in the system block.

20. The FLASH memory control method as claimed in claim 12, wherein:
  ignoring, during the power restoration process, the last two programmed pages of the at least one replay-protected memory block when there is an even number of programmed pages of the at least one replay-protected memory block but no success flag is found in the system block.

21. The FLASH memory control method as claimed in claim 12, wherein:
  confirming, during the power restoration process, the last two programmed pages of the at least one replay-protected memory block when there is an even number of programmed pages of the at least one replay-protected memory block and the success flag is found in the system block.

22. The FLASH memory control method as claimed in claim 12, wherein:
  confirming, during the power restoration process, data synchronization of the at least one replay-protected memory block when there is an even number of programmed pages of the at least one replay-protected memory block and the success flag is found in the system block.

\* \* \* \* \*